(12) United States Patent
Lee et al.

(10) Patent No.: US 10,739,895 B2
(45) Date of Patent: Aug. 11, 2020

(54) DISPLAY DEVICE

(71) Applicant: Samsung Display Co., Ltd., Yongin-si (KR)

(72) Inventors: Sangwook Lee, Yongin-si (KR); Chang Ok Kim, Yongin-si (KR); SungHoon Yang, Seoul (KR); Junmo Im, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/554,422

(22) Filed: Aug. 28, 2019

(65) Prior Publication Data

US 2019/0391693 A1 Dec. 26, 2019

Related U.S. Application Data

(63) Continuation of application No. 15/889,340, filed on Feb. 6, 2018, now Pat. No. 10,444,884, which is a
(Continued)

(30) Foreign Application Priority Data

Oct. 10, 2014 (KR) .................. 10-2014-0136858

(51) Int. Cl.
*G06F 3/041* (2006.01)
*H01L 27/32* (2006.01)
(Continued)

(52) U.S. Cl.
CPC ............ *G06F 3/0412* (2013.01); *G06F 3/044* (2013.01); *H01L 27/323* (2013.01);
(Continued)

(58) Field of Classification Search
CPC ..... G06F 3/041; G06F 3/0416; H01L 27/323; H01L 51/56
(Continued)

(56) References Cited

U.S. PATENT DOCUMENTS 7,125,758 B2 10/2006 Choi et al.
8,502,217 B2 8/2013 Sato et al.
(Continued)

FOREIGN PATENT DOCUMENTS

CN 101075557 11/2007
CN 103649886 3/2014
(Continued)

OTHER PUBLICATIONS

Office Action dated Jun. 28, 2019, in Chinese Patent Application No. 201510649357.7.
(Continued)

*Primary Examiner* — Calvin C Ma
(74) *Attorney, Agent, or Firm* — H.C. Park & Associates, PLC

(57) ABSTRACT

A display device includes a display part that displays an image, a touch part on the display part, the touch part including a first conductive layer on the display part, a lower inorganic layer on the first conductive layer, an upper inorganic layer covering the lower inorganic layer and a second conductive layer on the upper inorganic layer. The upper inorganic layer includes substantially a same material as the lower inorganic layer. The upper inorganic layer has a hydrogen atomic percent less than a hydrogen atomic percent of the lower inorganic layer.

18 Claims, 11 Drawing Sheets

Related U.S. Application Data continuation of application No. 14/855,830, filed on Sep. 16, 2015, now Pat. No. 9,927,896.

(51) Int. Cl.
*H01L 51/52* (2006.01)
*G06F 3/044* (2006.01)

(52) U.S. Cl.
CPC .................. *H01L 51/5253* (2013.01); *G06F 2203/04103* (2013.01); *G06F 2203/04111* (2013.01)

(58) Field of Classification Search
USPC .......................................... 345/102, 173–174
See application file for complete search history.

(56) References Cited

U.S. PATENT DOCUMENTS

| | | | |
|---|---|---|---|
| 9,095,017 | B2 | 7/2015 | Yi et al. |
| 9,098,247 | B2 | 8/2015 | Chen et al. |
| 9,330,811 | B2 | 5/2016 | Ichiryu et al. |
| 9,626,024 | B1 * | 4/2017 | Tan ....................... G06F 3/0412 |
| 9,927,896 | B2 | 3/2018 | Lee et al. |
| 10,217,774 | B2 | 2/2019 | Xie et al. |
| 10,532,545 | B2 * | 1/2020 | Fushimi .................. B32B 5/022 |
| 2015/0301667 | A1 | 10/2015 | Yano et al. |
| 2016/0103549 | A1 * | 4/2016 | Lee ....................... H01L 27/323 345/173 |
| 2016/0370902 | A1 | 12/2016 | Aridomi et al. |

FOREIGN PATENT DOCUMENTS

| | | |
|---|---|---|
| CN | 103842948 | 6/2014 |
| CN | 103887343 | 6/2014 |
| JP | 53126272 | 11/1978 |
| JP | 2005311365 | 11/2005 |
| JP | 2009141002 | 6/2009 |
| KR | 1020110048683 | 5/2011 |
| KR | 1020130052187 | 5/2013 |
| KR | 1020140025251 | 3/2014 |
| KR | 1020140043686 | 4/2014 |

OTHER PUBLICATIONS

Notice of Allowance dated Nov. 17, 2017, in U.S. Appl. No. 14/855,830.
Non-Final Office Action dated Jun. 1, 2018, in U.S. Appl. No. 15/889,340.
Notice of Allowance dated Apr. 30, 2019, in U.S. Appl. No. 15/889,340.

* cited by examiner

DISPLAY DEVICE

CROSS-REFERENCE TO RELATED APPLICATIONS

This application is a Continuation of U.S. patent application Ser. No. 15/889,340, filed Feb. 6, 2018, which is a Continuation of U.S. patent application Ser. No. 14/855,830, filed Sep. 16, 2015, which issued as U.S. Pat. No. 9,927,896, and claims priority from and the benefit of Korean Patent Application No. 10-2014-0136858, filed Oct. 10, 2014, each of which is hereby incorporated by reference for all purposes as if fully set forth herein.

BACKGROUND

1. Field

Embodiments relate to a display device and a method of manufacturing the same.

2. Description of the Related Art

In recent years, a display device generally includes a display part and a touch part. The touch part obtains coordinate information about a position at which a touch event occurs and provides information to the display part. The display part displays an image corresponding to the information provided from the touch part.

SUMMARY

Embodiments are directed to a display device including a display part that displays an image, a touch part on the display part, the touch part including a first conductive layer on the display part, a lower inorganic layer on the first conductive layer, an upper inorganic layer covering the lower inorganic layer and a second conductive layer on the upper inorganic layer. The upper inorganic layer includes substantially a same material as the lower inorganic layer. The upper inorganic layer has a hydrogen atomic percent less than a hydrogen atomic percent of the lower inorganic layer.

The hydrogen atomic percent of the upper inorganic layer may be greater than 0 and less than or equal to about 20.

The upper inorganic layer may include silicon nitride.

The second conductive layer may include copper.

The lower inorganic layer may have a breakdown voltage equal to or greater than about 5 MV/cm.

The lower inorganic layer may have a thickness greater than a thickness of the upper inorganic layer.

The display part may include a base substrate, an organic light emitting diode on the base substrate, and a thin film encapsulation layer on the base substrate, the thin film encapsulation layer covering the organic light emitting diode and including an inorganic material. The first conductive layer is directly on the thin film encapsulation layer.

The first conductive layer may include first touch electrodes on the thin film encapsulation layer, the first touch electrodes extending in a first direction and being arranged in a second direction crossing the first direction. The second conductive layer may include second touch electrodes respectively crossing the first touch electrodes and insulated from the first touch electrodes by the upper inorganic layer and the lower inorganic layer.

Each of the first touch electrodes may include first sensing parts arranged in the first direction and spaced apart from each other and first connection parts, each of the first connection parts being between the first sensing parts to connect two first sensing parts adjacent to each other among the first sensing parts. Each of the second touch electrodes may include second sensing parts arranged in the second direction and spaced apart from each other, and second connection parts, each of the second connection parts being between the second sensing parts to connect two second sensing parts adjacent to each other among the second sensing parts.

The first conductive layer may include first sensing parts on the thin film encapsulation layer, the first sensing parts being arranged in a first direction and spaced apart from each other, connection parts on the thin film encapsulation layer and extending in the first direction, each connection part connecting two first sensing parts adjacent to each other among the first sensing parts, and second sensing parts on the thin film encapsulation layer, the second sensing parts being arranged in a second direction crossing the first direction, spaced apart from each other, and insulated from the first sensing parts and the connection parts. The second conductive layer may include bridge electrodes on the upper and lower inorganic layers, each of the bridge electrodes connecting two second sensing parts adjacent to each other among the second sensing parts through a thru-hole defined through the upper inorganic layer and the lower inorganic layer.

Embodiments are also directed to a method of manufacturing a display device including providing a display panel, forming a first electrode layer on the display panel, forming an insulating layer including silicon nitride on the first electrode layer, and forming a second conductive layer on the insulating layer. Forming the insulating layer may include supplying a first gas on the first conductive layer to form a lower insulating layer and supplying a second gas on the lower insulating layer to form an upper insulating layer. The first gas may include silane, nitrogen, ammonia, and hydrogen, and the second gas may include silane, nitrogen, and hydrogen.

The second gas may be obtained by substantially removing ammonia from the first gas.

The lower insulating layer may have a hydrogen atomic percent exceeding about 20, the hydrogen atomic percent of the lower insulating layer being greater than the hydrogen atomic percent of the upper insulating layer. The upper insulating layer may have a hydrogen atomic percent that is greater than 0 and equal to or less than about 20.

Forming the insulating layer may be performed at a temperature less than or equal to about 85° C.

An amount of hydrogen in the first gas may be greater than about three times an amount of nitrogen in the second gas.

An amount of silane in the second gas is less than an amount of silane in the first gas.

The display panel may include a base substrate, an organic light emitting diode on the base substrate, and a thin film encapsulation layer covering the organic light emitting diode, the first conductive layer being formed directly on the thin film encapsulation layer.

Forming the second conductive layer may be performed by a wet etching process using an etching solution. An etching rate of the upper insulating layer against may be about 3 Å/s.

Forming the first conductive layer may include forming first electrodes on the thin film encapsulation layer such that the first electrodes extend in a first direction and are arranged in a second direction crossing the first direction. Forming the second conductive layer may include forming second electrodes on the upper insulating layer to cross the first electrodes.

The first conductive layer may include first electrodes on the thin film encapsulation layer, the first electrodes extending in a first direction and being arranged in a second direction crossing the first direction, and second electrodes being between the first electrodes, the second electrodes being spaced apart from each other in the second direction. Forming the second conductive layer may include forming thru-holes through the upper insulating layer and the lower insulating layer, and forming connection electrodes on the upper insulating layer, the connection electrodes connecting the second electrodes through the thru-holes.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
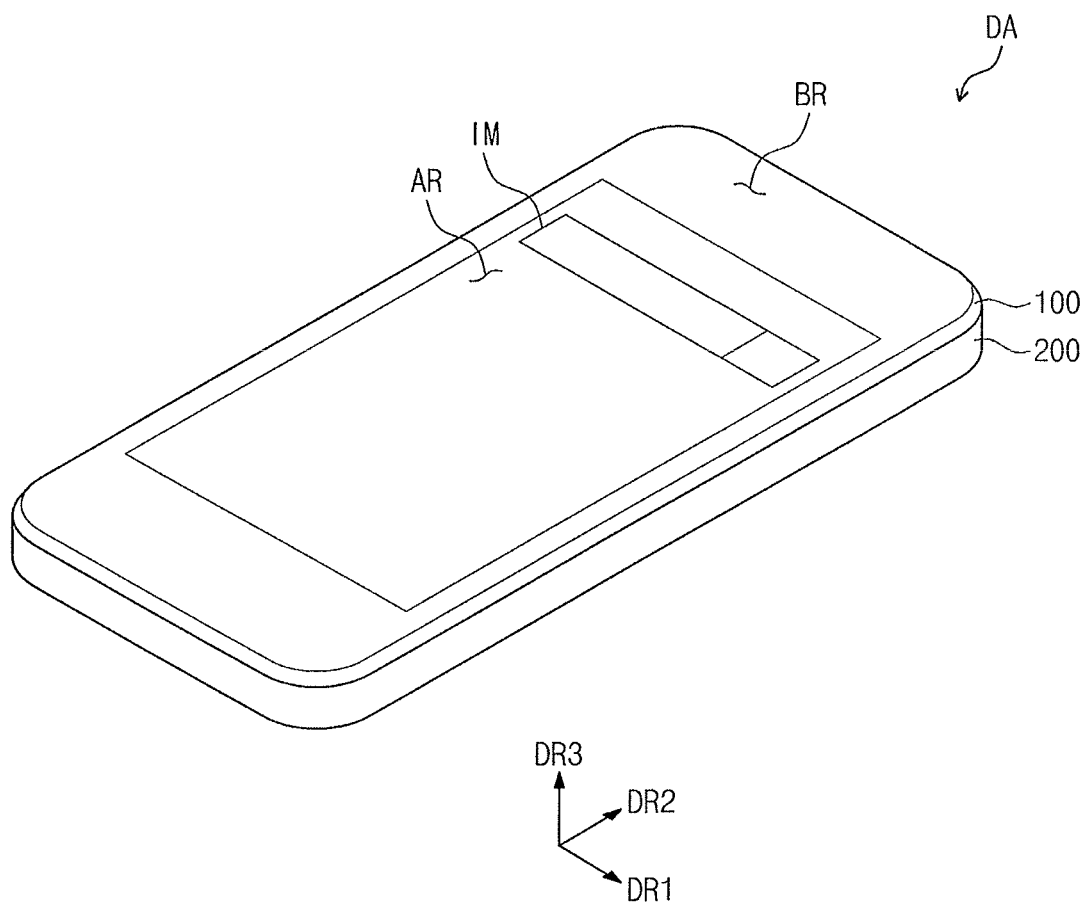
FIG. 1 illustrates an assembled perspective view showing a display device according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "between" two layers, it can be the only layer between the two layers, or one or more intervening layers may also be present. Like reference numerals refer to like elements throughout.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Unless otherwise defined, all terms (including technical and scientific terms) used herein have the same meaning as commonly understood by one of ordinary skill in the relevant art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
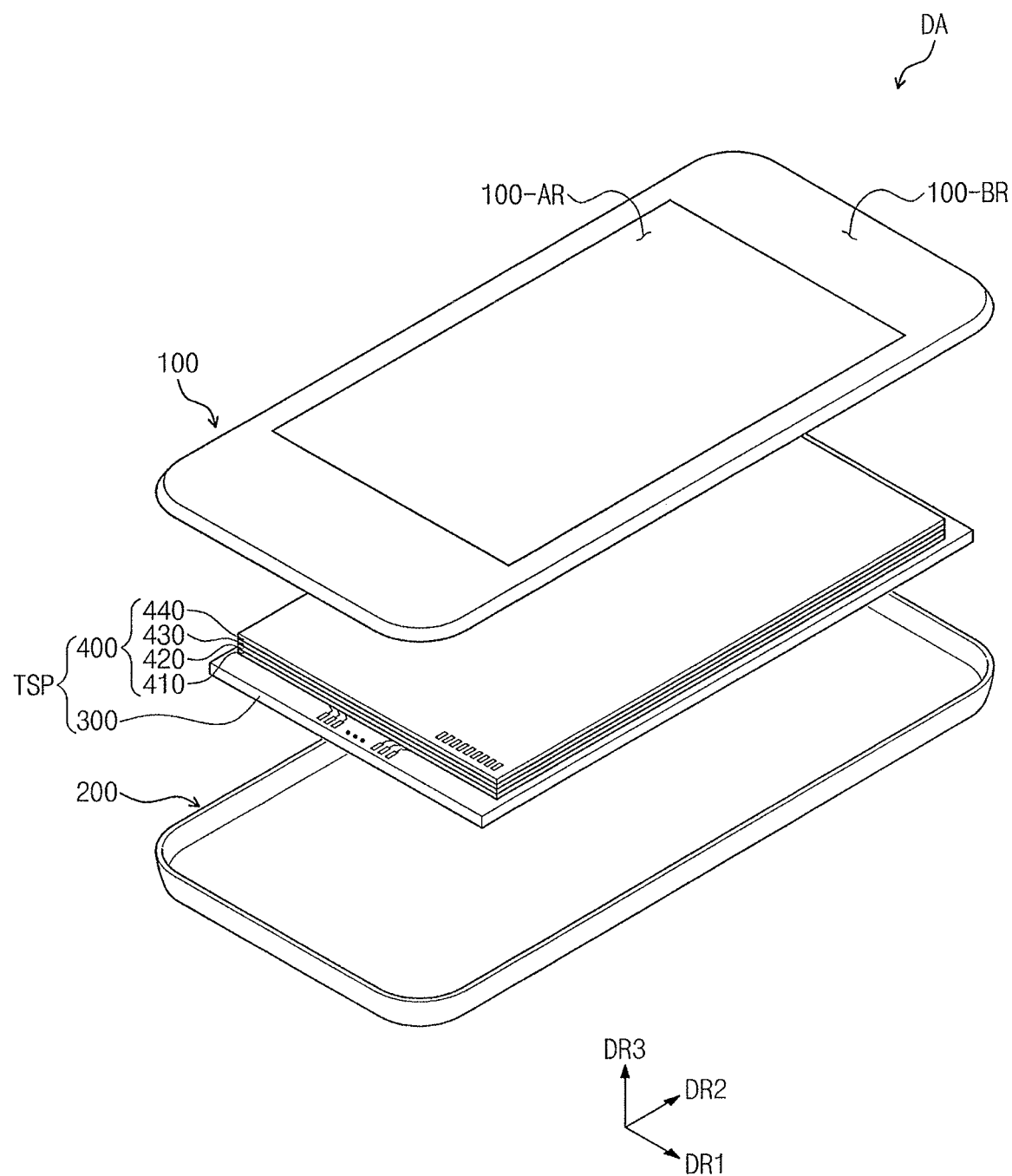
FIG. 2 illustrates an exploded perspective view showing the display device shown in FIG. 1.

FIG. 1 illustrates an assembled perspective view showing a display device DA according to an exemplary embodiment and FIG. 2 illustrates an exploded perspective view showing the display device shown in FIG. 1.

Referring to FIGS. 1 and 2, the display device DA may include a display area AR and a non-display area BR, which are disposed on a plane surface defined by a first direction DR1 and a second direction DR2 crossing the first direction DR1.

The display area AR is an area in which an image IM is displayed. A user may obtain information from the image IM displayed through the display area AR.

The non-display area BR may surround an edge of the display area AR. The non-display area BR may define the display area AR. The image IM is not displayed in the non-display area BR. An external input device, such as a button, an input port, etc., may be further disposed in the non-display area BR.

The display device DA may include an upper protective member 100, a lower protective member 200, and a touch screen panel TSP. The upper and lower protective members 100 and 200 may define an outer shape of the display device DA.

The upper and lower protective members 100 and 200 may be coupled to each other to protect the touch screen panel TSP. Each of the upper and lower protective members 100 and 200 may be a plastic substrate, a metal substrate, a glass substrate, or a film.

The upper protective member 100 may cover the touch screen panel TSP. The upper protective member 100 may include a transmission area 100-AR and a non-transmission area 100-BR.

The transmission area 100-AR may be in an overlapping relationship with the display area AR. The transmission area 100-AR may transmit light such that the image IM is perceived by the user. The user may perceive the image IM through the transmission area 100-AR.

The transmission area 100-AR may be defined by an opening portion or by using a transparent material through which the light transmits. The transmission area 100-AR may transmit the image IM and may protect the inside of the display device DA.

The non-transmission area 100-BR may surround the transmission area 100-AR. The non-transmission area 100-BR may have a frame shape. The non-transmission area 100-BR may block the light provided from the touch screen panel TSP. The non-transmission area 100-BR may prevent the light from traveling to the non-display area BR.

The lower protective member 200 may include a plane surface substantially parallel to the upper protective member 100 and a sidewall bent from the plane surface to an upper direction DR3 (hereinafter, referred to as a third direction). The sidewall may be bent from sides defining the plane surface to surround an edge of the plane surface.

The plane surface and the sidewall may define a predetermined inner space. The lower protective member 200 may accommodate the touch screen panel TSP in the inner space thereof. The sidewall may be coupled to the edge of the upper protective member 100.

The touch screen panel TSP may include a display part 300 and a touch part 400. The display part 300 and the touch part 400 may be sequentially stacked in the third direction DR3.

The display part 300 may generate and display the image IM. The display part 300 may be, for example, a display panel that displays the image IM in response to a voltage source applied thereto.

A suitable display panel, such as a liquid crystal display panel, an organic light emitting display panel, an electrophoretic display panel, an electrowetting display panel, etc., may be used as the display part 300. For convenience of description, the organic light emitting display panel will be described as the display part 300 in the present exemplary embodiment.

When the organic light emitting display panel is used as the display part 300, the display part 300 self-emits light without using a separate light source. Accordingly, the display device DA may be slim and lightweight. The display device DA including the display part 300 may be applied to a mobile device, a portable device, or a flexible device that may be easily carried in a pocket.

The touch part 400 may sense external touch information and apply the sensed external touch information to the display device DA as an input signal. The external touch information may be produced by the touch of the user, which may occur on the upper protective member 100. The touch part 400 may be directly disposed on the display part 300.

The touch part 400 may include a first conductive layer 410, an insulating layer 420, a second conductive layer 430, and an upper layer 440. The first conductive layer 410, the insulating layer 420, the second conductive layer 430, and the upper layer 440 may be sequentially stacked in the third direction DR3.

The first conductive layer 410 may include a conductive material. For instance, the first conductive layer 410 may include at least one of a metal material, a conductive oxide, a metal oxide, a conductive polymer, and an alloy thereof.

The second conductive layer 430 may include the same material as the first conductive layer 410. As an example, the second conductive layer 430 may include copper.

Each of the first and second conductive layers 410 and 430 may include a plurality of conductive patterns. The conductive patterns of the first conductive layer 410 may be insulated from the conductive patterns of the second conductive layer 430 while crossing the conductive patterns of the second conductive layer 430. The conductive patterns may have various shapes.

The insulating layer 420 may insulate the first conductive layer 410 from the second conductive layer 430. The insulating layer 420 may include an inorganic material. For instance, the insulating layer 420 may include at least one of silicon nitride and silicon oxide. For example, the insulating layer 420 may include silicon nitride.

The inorganic material may include inorganic molecules containing hydrogen atoms in various ratios. For instance, the silicon nitride may include hydrogen atoms in addition to silicon atoms and nitrogen atoms. The ratio of the hydrogen atoms combined with the silicon atoms may be in various combinations.

The insulating layer 420 may have a multi-layer structure. In the present exemplary embodiment, the insulating layer 420 may be configured to include at least two layers stacked one on another. The two layers may include substantially the same inorganic material.

The upper layer 440 may be a plastic substrate, a glass substrate, or a film. In some implementations, the upper layer 440 may be an optical film, e.g., a polarizing plate. In some implementations, the upper layer 440 may be omitted from the touch part 400.

Figure 3A:
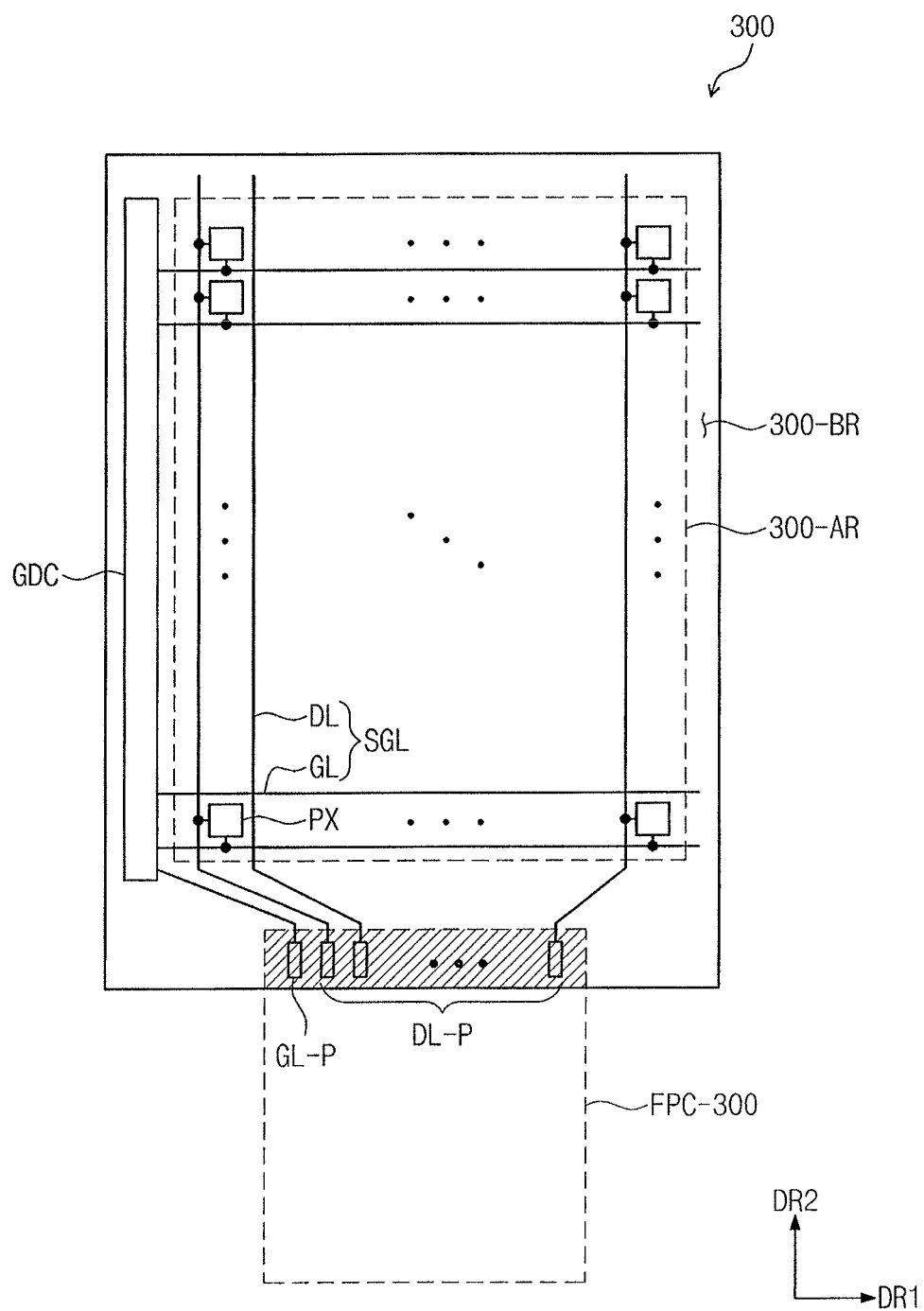
FIG. 3A illustrates a plan view showing a display part according to an exemplary embodiment.
Figure 3B:
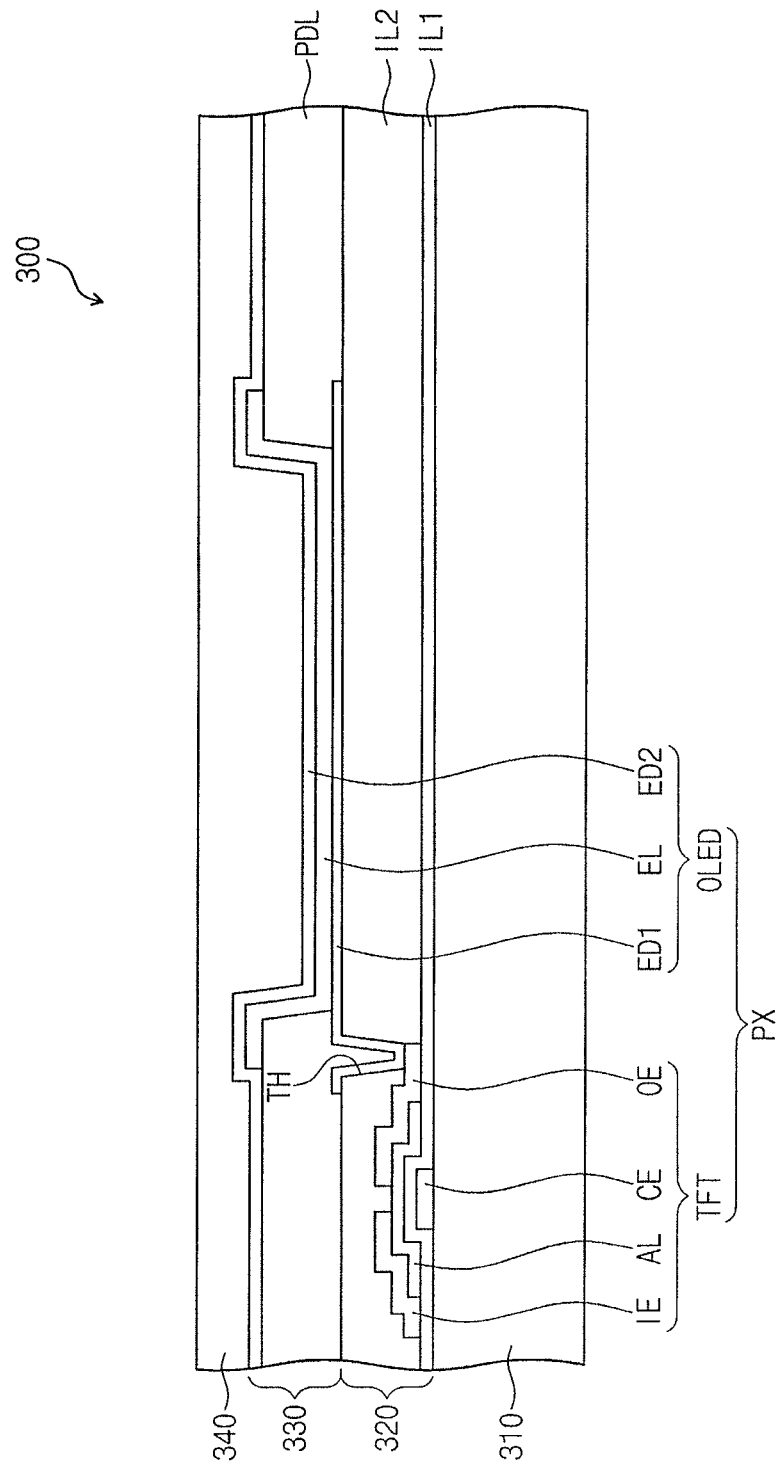
FIG. 3B illustrates a cross-sectional view showing a display part according to an exemplary embodiment.

FIG. 3A illustrates a plan view showing a display part according to an exemplary embodiment. FIG. 3B is a cross-sectional view showing a display part according to an exemplary embodiment. In FIGS. 3A and 3B, the same reference numerals denote the same elements as in FIGS. 1 and 2, and thus detailed descriptions of the same elements will not be repeated.

Referring to FIG. 3A, the display part 300 may include a pixel area 300-AR and a peripheral area 300-BR, which are disposed on a plane surface defined by the first and second directions DR1 and DR2.

The pixel area 300-AR may display the image. The pixel area 300-AR may be overlapped with the display area AR. The peripheral area 300-BR may surround the pixel area 300-AR.

The display part 300 may include a plurality of signal lines SGL, a gate driving circuit GDC, and a plurality of pixels PX. The signal lines SGL may be configured to include a plurality of gate lines GL and a plurality of data lines DL.

The gate lines GL may extend in the first direction DR1 and may be arranged in the second direction DR2. The data lines DL may be insulated from the gate lines GL while crossing the gate lines GL. The gate lines GL and the data lines DL may be disposed in the pixel area 300-AR and the peripheral area 300-BR.

The gate driving circuit GDC may be disposed in the peripheral area 300-BR. The gate driving circuit GDC may be connected to the gate lines GL. The gate driving circuit GDC may sequentially apply scan signals to the gate lines GL.

The gate driving circuit GDC may be provided in various ways. For example, the gate driving circuit GDC may be mounted on the display part 300 by a chip-on-glass (COG) method or a chip-on-film (COF) method. The gate driving circuit GDC may be separately prepared, and then coupled to the display part 300.

The data lines DL may be disposed in the pixel area 300-AR and may extend into the peripheral area 300-BR. Data pads DL-P may be disposed at one ends of the data lines DL in the peripheral area 300-BR. The data lines DL may receive data signals through the data pads DL-P.

The display part 300 may be connected to a main circuit FPC-300. In FIG. 3A, the main circuit FPC-300 is indicated by a dotted line.

The main circuit FPC-300 may include a data driving circuit. The main circuit FPC-300 may be connected to the data pads DL-P and may apply the data signals to the data lines DL.

In addition, the main circuit FPC-300 may be connected to a gate pad GL-P. The gate pad GL-P may be disposed in the display part 300 to be adjacent to the data pads DL-P.

The gate pad GL-P may be connected to the gate driving circuit GDC. The main circuit FPC-300 may apply a control signal to the gate driving circuit through the gate pad GL-P.

The pixels PX may be disposed in the pixel area 300-AR. Each of the pixels PX may be connected to a corresponding gate line of the gate lines GL and a corresponding data line of the data lines DL.

The pixels PX may be operated in response to the scan signals provided through the gate lines GL to generate the image corresponding to the data signals provided through the data lines DL.

FIG. 3B illustrates the cross-sectional view of the display part 300 together with one pixel PX. The display part 300 may include a base substrate 310, a device layer 320, a display layer 330, and a thin film encapsulation layer 340. The pixel PX may include a thin film transistor TFT and an organic light emitting diode OLED.

The base substrate 310 may be a glass substrate, a plastic substrate, or a film. The device layer 320 may be disposed on the base substrate 310. The device layer 320 may include the thin film transistor TFT, a first insulating layer ILL and a second insulating layer IL2.

The thin film transistor TFT may include a control electrode CE, a semiconductor layer AL, an input electrode IE, and an output electrode OE. The control electrode CE may be disposed on the base substrate 310. The control electrode CE may be branched from the gate line corresponding to the pixel PX.

The first insulating layer IL1 may be disposed on the base substrate 310 to cover the control electrode CE. The first insulating layer IL1 may cover the control electrode CE and the gate lines. The first insulating layer IL1 may include at least one of inorganic and organic materials. The first insulating layer IL1 may have a single-layer or multi-layer structure.

The semiconductor layer AL may be disposed on the first insulating layer IL1. The semiconductor layer AL may be in an overlapping relationship with the control electrode CE. The semiconductor layer AL may include amorphous silicon, polysilicon, or metal oxide semiconductor.

The input electrode IE and the output electrode OE may be disposed on the first insulating layer IL1 and spaced apart from each other. The data lines DL may be disposed on the first insulating layer IL1. The input electrode IE may be branched from the data line corresponding to the pixel PX.

Each of the input electrode IE and the output electrode OE may be in an overlapping relationship with a portion of the semiconductor layer AL. The semiconductor layer AL may further include an ohmic contact layer disposed in areas respectively overlapped with the input electrode IE and the output electrode OE.

The input electrode IE and the output electrode OE may be spaced apart from each other to expose a portion of the semiconductor layer AL that corresponds to a distance between the input electrode IE and the output electrode OE.

The second insulating layer IL2 may be disposed on the first insulating layer IL1 to cover the thin film transistor TFT. The second insulating layer IL2 may electrically insulate the thin film transistor TFT from other elements.

The second insulating layer IL2 may include at least one of inorganic and organic materials. The second insulating layer IL2 may have a single- or multi-layer structure.

FIG. 3B illustrates a thin film transistor TFT having a bottom-gate structure. In some implementations, the thin film transistor TFT may have a top-gate structure, a dual gate structure, or a planar structure.

The display layer 330 may be disposed on the device layer 320. The display layer 330 may include the organic light emitting diode OLED and a pixel definition layer PDL. The organic light emitting diode OLED may include a first electrode ED1, an organic layer EL, and a second electrode ED2.

The first electrode ED1 may be disposed on the second insulating layer IL2. The first electrode ED1 may be connected to the output electrode OE through a thru-hole TH formed through the second insulating layer IL2.

The first electrode ED1 may be a transmissive electrode, a transflective electrode, or a reflective electrode. For instance, when the first electrode ED1 is a transmissive electrode, the first electrode ED1 may include a transparent metal oxide, e.g., indium tin oxide (ITO), indium zinc oxide (IZO), indium tin zinc oxide (ITZO), etc.

When the first electrode ED1 is a transflective or reflective electrode, the first electrode ED1 may include silver (Ag), magnesium (Mg), aluminum (Al), platinum (Pt), palladium (Pd), gold (Au), nickel (Ni), neodymium (Nd), iridium (Ir), chromium (Cr), or mixtures thereof.

The first electrode ED1 may have a single-layer structure or a multi-layer structure of layers. For instance, the first electrode ED1 may have a single-layer structure of indium tin oxide (ITO), silver (Ag), or a metal mixture, a double-layer structure of indium tin oxide/magnesium (ITO/Mg), a double-layer structure of indium tin oxide/magnesium fluoride (ITO/MgF), or a triple-layer structure of indium tin oxide/silver/indium tin oxide (ITO/Ag/ITO).

The pixel definition layer PDL may be disposed on the second insulating layer IL2. The pixel definition layer PDL may include at least one of an organic material and an inorganic material. The pixel definition layer PDL may expose at least a portion of the first electrode ED1.

The organic layer EL may be disposed on the first electrode ED1. The organic layer EL may cover the exposed portion of the first electrode ED1 through the pixel definition layer PDL. The organic layer EL may include a light emitting layer that generates the light in response to an electrical signal applied thereto.

The light emitting layer may include materials respectively emitting lights of red, green, and blue colors and may include a fluorescent material or phosphor material.

The organic layer EL may have a single-layer structure or a multi-layer structure. When the organic layer EL has the multi-layer structure, a light efficiency of the organic light emitting diode OLED may be improved.

The second electrode ED2 may be disposed on the organic layer EL and the pixel definition layer PDL. The second electrode ED2 may be disposed over the entire surface of the display part 300.

The second electrode ED2 may be a transmissive electrode, a transflective electrode, or a reflective electrode. For instance, the second electrode ED2 may include lithium (Li), calcium (Ca), lithium fluoride/calcium (LiF/Ca), lithium fluoride/aluminum (LiF/Al), aluminum (Al), magnesium (Mg), silver (Ag), or compounds or mixtures thereof.

The second electrode ED2 may include silver (Ag), magnesium (Mg), aluminum (Al), platinum (Pt), palladium (Pd), gold (Au), nickel (Ni), neodymium (Nd), iridium (Ir), chromium (Cr), or mixtures thereof, or may include a transparent conductive oxide, such as indium tin oxide (ITO), indium zinc oxide (IZO), zinc oxide (ZnO), indium tin zinc oxide (ITZO), etc.

The first and second electrodes ED1 and ED2 may include different materials according to a light emitting type of the organic light emitting diode OLED. For instance, when the organic light emitting diode OLED is a front surface light emitting type, the first electrode ED1 may be the reflective electrode and the second electrode ED2 may be the transmissive or transflective electrode. On the other hand, when the organic light emitting diode OLED is a rear surface light emitting type, the first electrode EL1 may be the transmissive or transflective electrode and the second electrode ED2 may be the reflective electrode.

The thin film encapsulation layer 340 may be disposed on the display layer 330. The thin film encapsulation layer 340 may encapsulate the organic light emitting diode OLED. The thin film encapsulation layer 340 may protect the organic light emitting diode OLED from moisture and oxygen.

The thin film encapsulation layer 340 may include a transparent insulating material. The thin film encapsulation layer 340 may include at least one of organic and inorganic materials. The thin film encapsulation layer 340 may further include a polarizing plate.

The thin film encapsulation layer 340 may have a single- or multi-layer structure. When the thin film encapsulation layer 340 has the multi-layer structure of layers, each layer may have a thickness of about 1 nm to about 50 nm. The display part 300 may be encapsulated by the thin film encapsulation layer 340, and thus, the display device may be slim.

Figure 4A:
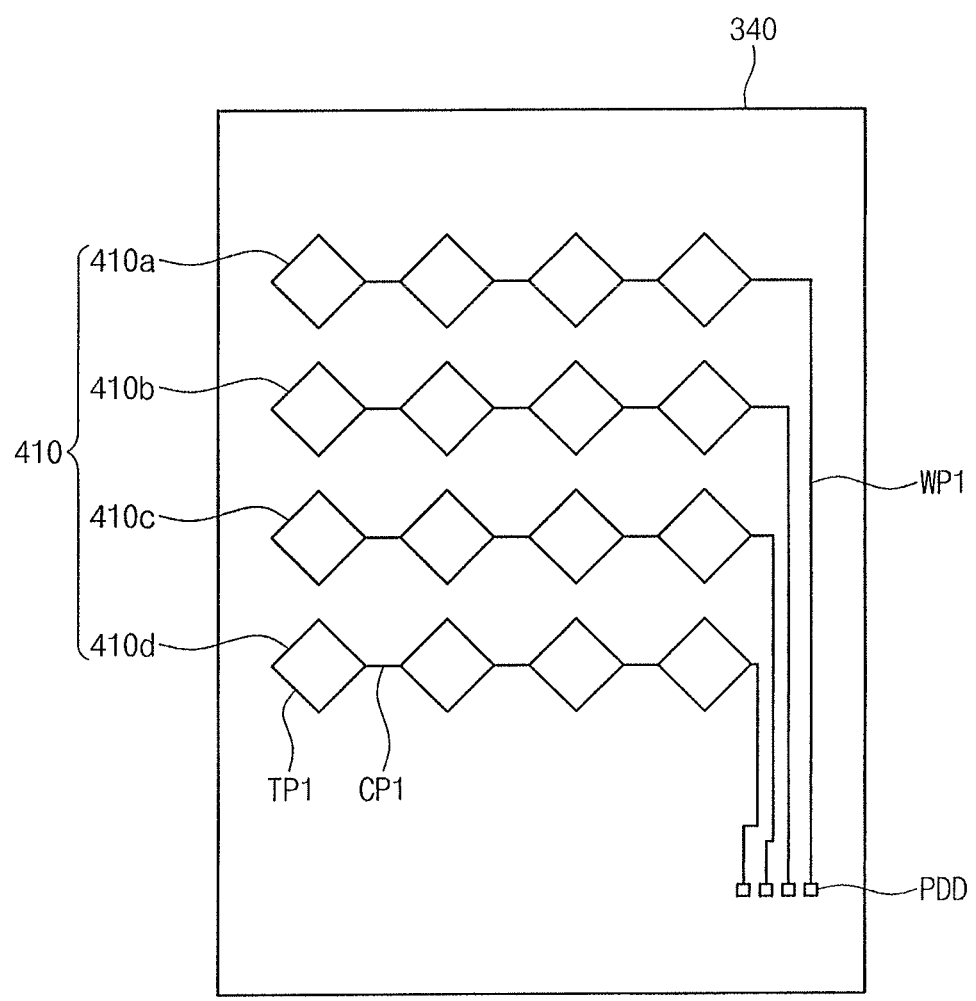
FIG. 4A illustrates a plan view showing a portion of a touch part according to an exemplary embodiment.
Figure 4B:
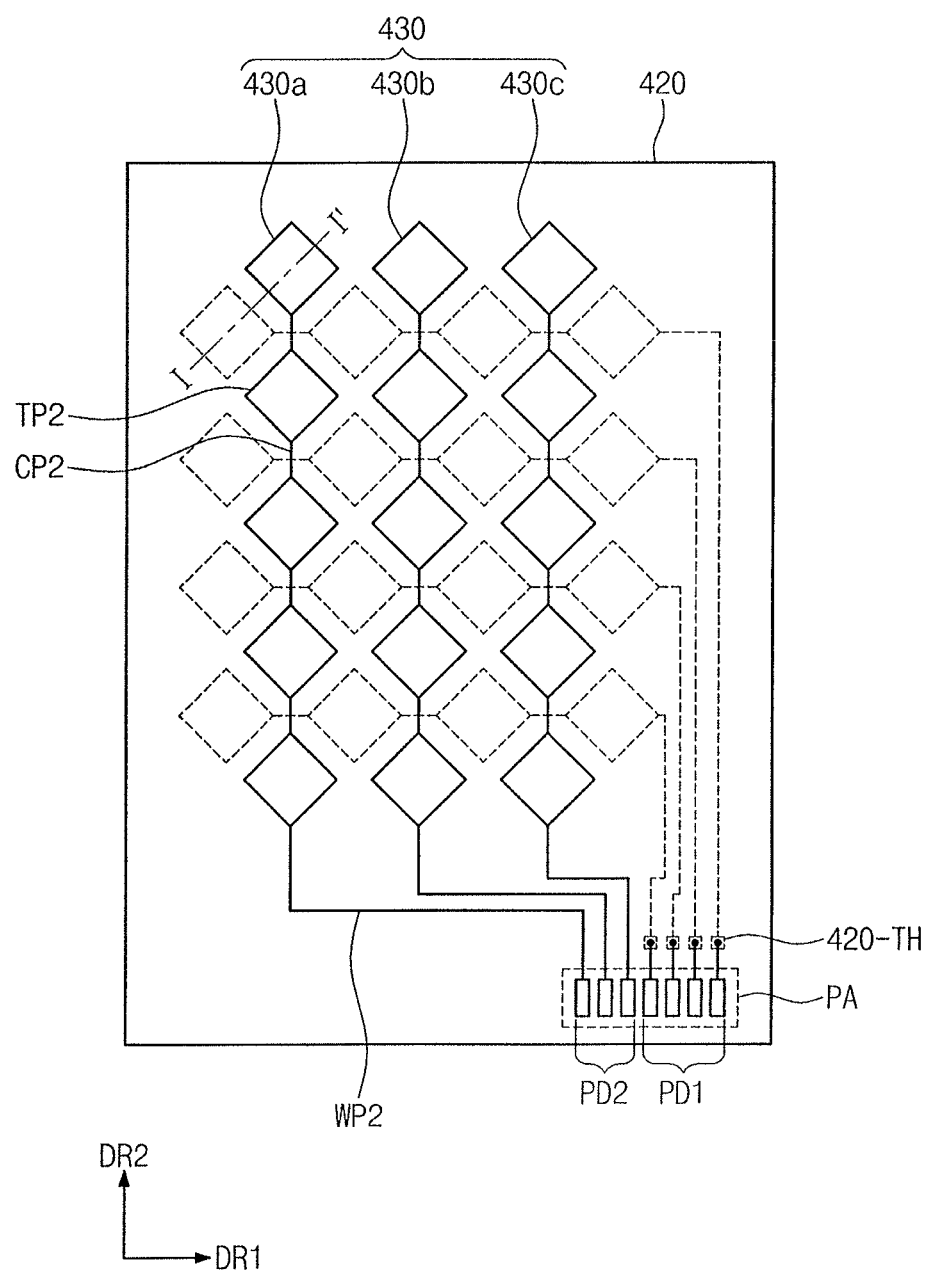
FIG. 4B illustrates a plan view showing a portion of a touch part according to an exemplary embodiment.
Figure 4C:
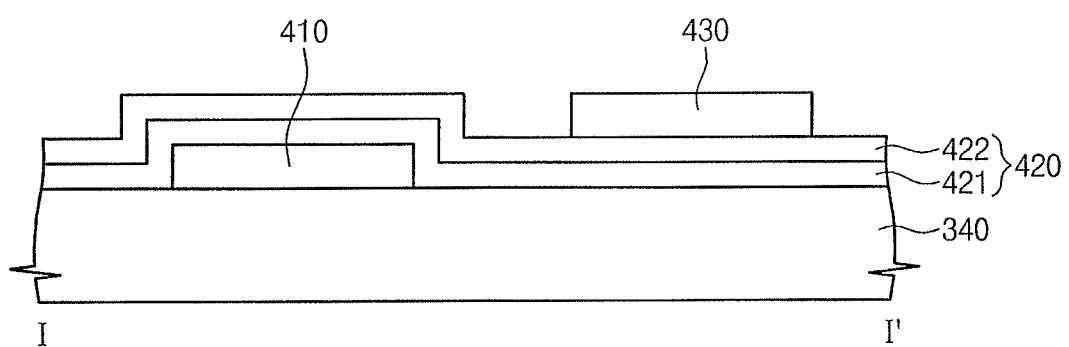
FIG. 4C illustrates a cross-sectional view taken along a line I-I' of FIG. 4B.

FIG. 4A illustrates a plan view showing a portion of a touch part according to an exemplary embodiment, FIG. 4B is a plan view showing a portion of a touch part according to an exemplary embodiment, and FIG. 4C is a cross-sectional view taken along a line I-I' of FIG. 4B.

Hereinafter, the touch part 400 will be described in detail with reference to FIGS. 4A to 4C. In FIGS. 4A to 4C, the same reference numerals denote the same elements in FIGS. 1 to 3B, and thus detailed descriptions of the same elements will not be repeated. In FIGS. 4A to 4C, the upper layer 440 (refer to FIG. 2), which may be omitted, is not shown.

Referring to FIG. 4A, the touch part 400 may be directly disposed on the display part 300. The first conductive layer 410 may be disposed on the thin film encapsulation layer 340.

The first conductive layer 410 may include a plurality of conductive patterns. The conductive patterns may include first touch electrodes 410a, 410b, 410c, and 410d extending in the first direction DR1 and arranged in the second direction DR2.

Each of the first touch electrodes 410a, 410b, 410c, and 410d may include first sensing parts TP1 and first connection parts CP1. The first sensing parts TP1 may be arranged in the second direction DR2 and spaced apart from each other in the first direction DR1. The first connection parts CP1 may be disposed between the first sensing parts TP1. Each of the first connection parts CP1 may connect two first sensing parts adjacent to each other.

The conductive layer 410 may further include outer wires WP1. One end of the outer wires WP1 may be connected to the first touch electrodes 410a, 410b, 410c, and 410d.

Lower pads PDD may be defined at the other end of the outer wires WP1. The lower pads PDD may be connected to first pads PD1 described later.

Referring to FIG. 4B, the insulating layer 420 may be disposed on the first conductive layer 410. The insulating layer 420 may cover the first conductive layer 410. The second conductive layer 430 may be disposed on the insulating layer 420. The insulating layer 420 may insulate the first conductive layer 410 from the second conductive layer 430.

The second conductive layer 430 may include a plurality of conductive patterns. The conductive patterns may include second touch electrodes 430a, 430b, and 430c extending in the second direction DR2 and arranged in the first direction DR1.

The second touch electrodes 430a, 430b, and 430c have substantially a similar structure as the first touch electrodes 410a, 410b, 410c, and 410d. For example, the second touch electrodes 430a, 430b, and 430c may be configured to include second sensing parts TP2 and second connection parts CP2.

The second sensing parts TP2 may be arranged in the first direction DR1 and spaced apart from each other. The second sensing parts TP2 may be disposed between the first sensing parts TP1, without overlapping the first sensing parts TP1, when viewed in a plan view.

The second connection parts CP2 may be disposed between the second sensing parts TP2. Each of the second connection parts CP2 may connect two second sensing parts TP2 adjacent to each other. The second connection parts CP2 may be disposed to cross the first connection parts CP1. The second connection parts CP2 may partially overlap the first connection parts CP1.

The second conductive layer 430 further includes outer wires WP2. One end of the outer wires WP2 may be respectively connected to the second touch electrodes 430a, 430b, and 430c. The other end of the outer wires WP2 may extend into a pad area PA.

The first pads PD1 and second pads PD2 may be disposed in the pad area PA. The first pads PD1 may be connected to the outer wires WP1 of the first conductive layer 410 and the second pads PD2 may be connected to the outer wires WP2 of the second conductive layer 420.

Thru-holes 420-TH may be formed through the insulating layer 420. The thru-holes 420-TH may overlap with the lower pads PDD. The first pads PD1 may be electrically connected to the lower pads PDD through the thru-holes 420-TH.

A touch driver may apply sensing signals to the first touch electrodes 410a, 410b, 410c, and 410d and the second touch electrodes 430a, 430b, and 430c. The touch driver includes a signal applier and a signal processor.

The signal applier may sequentially apply the sensing signals to the first touch electrodes 410a, 410b, 410c, and 410d or the second touch electrodes 430a, 430b, and 430c. The signal processor may sense a delay value of the sensing signals to sense a touch coordinate. The touch driver may be directly mounted on the insulating layer 420 or mounted on a separate circuit board for the touch event.

Referring to FIG. 4C, the insulating layer 420 may include a first insulating layer 421 and a second insulating layer 422. The first insulating layer 421 (hereinafter, referred to as a lower insulating layer) may be disposed at a lower portion of the insulating layer 420. The second insulating layer 422 (hereinafter, referred to as an upper insulating layer) may be disposed at an upper portion of the insulating layer 420.

In the present exemplary embodiment, the lower insulating layer 421 may provide the electrical durability of the insulating layer 420 and the upper insulating layer 422 may provide the physical durability of the insulating layer 420. For example, the lower insulating layer 421 may improve a breakdown voltage of the insulating layer 420, and the upper insulating layer 422 may reduce an etching rate of the insulating layer 420 to improve a resistance of the insulating layer 420 against an etching solution.

In general, as an amount of hydrogen atoms in a layer becomes larger, the etching rate of the layer increases. When the layer has a high etching rate with respect to the etching solution, the layer may be vulnerable to the etching solution. When the layer has a low etching rate with respect to the etching solution, the layer may be stable to the etching solution. Accordingly, the etching rate of the insulating layer 420 may exert a strong influence on the insulating layer 420 when the insulating layer 420 is etched.

The ratio of hydrogen atoms in the upper insulating layer 422 may be lower than that of hydrogen atoms in the lower insulating layer 421. Therefore, the upper insulating layer 422 may have a lower etching rate than the lower insulating layer 421.

In the present exemplary embodiment, silicon nitride may be represented by the formula SiNx indicating that the nitrogen atoms may vary. Accordingly, the ratio of hydrogen atoms to silicon atoms may also vary. For example, silicon nitride may be a compound obtained by combining nitrogen atoms with silicon atoms, but hydrogen atoms may be added in accordance with the number of nitrogen atoms combined with hydrogen atoms.

In the present exemplary embodiment, a ratio of hydrogen atoms contained in each layer may be represented by an atomic percent (at %). The term "atomic percent" refers to a percentage of hydrogen atoms with respect to various atoms contained in each layer.

In the display device according to the present exemplary embodiment, the insulating layer in which the atomic percent of hydrogen atoms is lower than that of the lower insulating layer 421 is employed as the upper insulating layer 422. Thus, the display device may prevent the lower insulating layer 421 from being damaged during the etching process.

In addition, a breakdown intensity of a specific layer is influenced by a layer density of the specific layer. The lower insulating layer 421 may have a relatively high layer density compared to the upper insulating layer 422.

Table 1 below represents the lower and upper insulating layers 421 and 422 compared to comparison examples. The insulating layer 420 will be described in detail with reference to the following Table 1.

TABLE 1

|  | Atomic percent of hydrogen (at %) | Etching rate (Å/s) | Breakdown voltage (MV/cm) |
| --- | --- | --- | --- |
| First comparison example | 24.0 | 2.5 | 6.8 |
| Second comparison example | 36.8 | 316.2 | 2.9 |
| Lower insulating layer | 31.0 | 61.5 | 5.0 |
| Upper insulating layer | 19.6 | 1.8 | 2.4 |

The first comparison example represents a silicon nitride layer formed at a high temperature of about 370° C., the second comparison example represents a silicon nitride layer formed at a low temperature of about 70° C., the lower insulating layer 421 includes silicon nitride formed at a low temperature of about 70° C., and the upper insulating layer 422 includes silicon nitride formed at a low temperature of about 70° C.

In detail, the lower insulating layer 421 is formed under conditions that a power is about 900 W, a distance between a deposition source and a target substrate is about 500 mils, and a pressure is about 1,000 mtorr. In this case, a deposition gas used to deposit the lower insulating layer 421 includes a nitrogen gas ($N_2$) of about 1,500 sccm (standard cubic centimeter per minute), an ammonia gas ($NH_3$) of about 500 sccm, a silane gas ($SiH_4$) of about 150 sccm, and a hydrogen gas ($H_2$) of about 4500 sccm.

The upper insulating layer 422 is formed under conditions that a power is about 500 W, a distance between a deposition source and a target substrate is about 1,000 mils, and a pressure is about 500 mtorr. In this case, a deposition gas used to deposit the upper insulating layer 422 includes the nitrogen gas ($N_2$) of about 3000 sccm, the silane gas ($SiH_4$) of about 50 sccm, and the hydrogen gas ($H_2$) of about 4500 sccm. The deposition gas used to deposit the upper insulating layer 422 does not include the ammonia gas ($NH_3$).

As described above, the lower insulating layer 421 and the upper insulating layer 422 have a different atomic percent of hydrogen. The etching rate shown in Table 1 represents an etching rate against an etching solution that reacts with copper.

In general, the silicon nitride layer formed at the high temperature has superior stability with respect to the etching solution, and the silicon nitride layer formed at the low temperature has a tendency to be vulnerable against the etching solution. As shown in Table 1, the first comparison example has relatively low etching rate of about 2.5 Å/s (angstrom per second) with respect to the etching solution.

The second comparison example has relatively high etching rate of about 316.2 Å/s with respect to the etching solution. When compared to the first comparison example, the second comparison example may be easily damaged during the etching process of etching copper, since the second comparison example easily reacts with the etching solution.

The upper insulating layer 422 according to the present exemplary embodiment includes about 19.6 at % of hydrogen atoms. Accordingly, the etching rate of the upper insulating layer 422 is about 1.8 Å/s, which is similar to that of the first comparison example. Therefore, the upper insulating layer 422 has superior stability with respect to the etching solution.

In detail, the amount of hydrogen atoms of the upper insulating layer 422 is in a range exceeding about 0 at % and equal to or smaller than about 20 at %. Therefore, the upper insulating layer 422 has the etching rate equal to or smaller than about 3 Å/s with respect to the etching solution that reacts with copper. The etching rate of the insulating layer 420 according to the present exemplary embodiment may be controlled by adjusting the atomic percent of hydrogen atoms. Thus, the stability of the insulating layer 420 may be improved.

Referring to Table 1, the lower insulating layer 421 has the etching rate of about 61.5 Å/s, which is lower than that of the second comparison example, but higher than that of the first comparison example. Thus, the lower insulating layer 421 may be slightly damaged by the etching solution.

The insulating layer 420 according to embodiments has the double-layer structure including the upper insulating layer 422 having relatively low etching rate covering the lower insulating layer 421. The second conductive layer 430 may be disposed on the upper insulating layer 422, Accordingly, the lower insulating layer 421 may be protected by the upper insulating layer 422. The second conducive layer 430 may be formed without damaging the insulating layer 420. Thus, the reliability of the insulating layer 420 may be improved when the display device is manufactured.

The silicon nitride layer formed at the high temperature may have a relatively high breakdown voltage compared to that of the silicon nitride layer formed at the low temperature. The term "breakdown voltage" refers to a maximum voltage in which Ohm's law, e.g., a current flowing through a layer is in proportion to a voltage applied to the layer, is maintained.

When the voltage higher than the breakdown voltage is applied to the layer, Ohm's law is ignored and an avalanche phenomenon, in which an extremely large current flows through the conductor, occurs in the layer. Therefore, as the breakdown voltage of the layer becomes higher, the electrical durability of the layer becomes higher against the voltage.

As shown in Table 1, the breakdown voltage of the lower insulating layer 421 is about 5.0 MV/cm (megavolts per centimeter), which is similar to that of the first comparison example. The lower insulating layer 421 has relatively high breakdown voltage compared to the second comparison example and the upper insulating layer 422, each having the breakdown voltage of about 2 MV/cm.

Although not shown in Table 1, the lower insulating layer 421 has a relatively higher density than t the upper insulating layer 422. The lower insulating layer 421 may be more densely deposited than the upper insulating layer 422 by controlling the deposition gas used in the process of depositing the lower insulating layer 421.

In general, as the density of the layer becomes higher, inner defects of the layer become smaller and the breakdown voltage becomes higher. Therefore, the lower insulating layer 421 has the breakdown voltage higher than that of the upper insulating layer 422. The lower insulating layer 421 has the breakdown voltage of about 5 MV/cm.

The lower insulating layer 421 according to the present exemplary embodiment has a thickness greater than that of the upper insulating layer 422. The insulating layer 420 may include the lower insulating layer 421 having the thickness greater than that of the upper insulating layer 422. Accordingly, the insulating layer 420 may have a high breakdown voltage. Thus, the electrical durability of the insulating layer 420 may be improved.

Figure 5A:
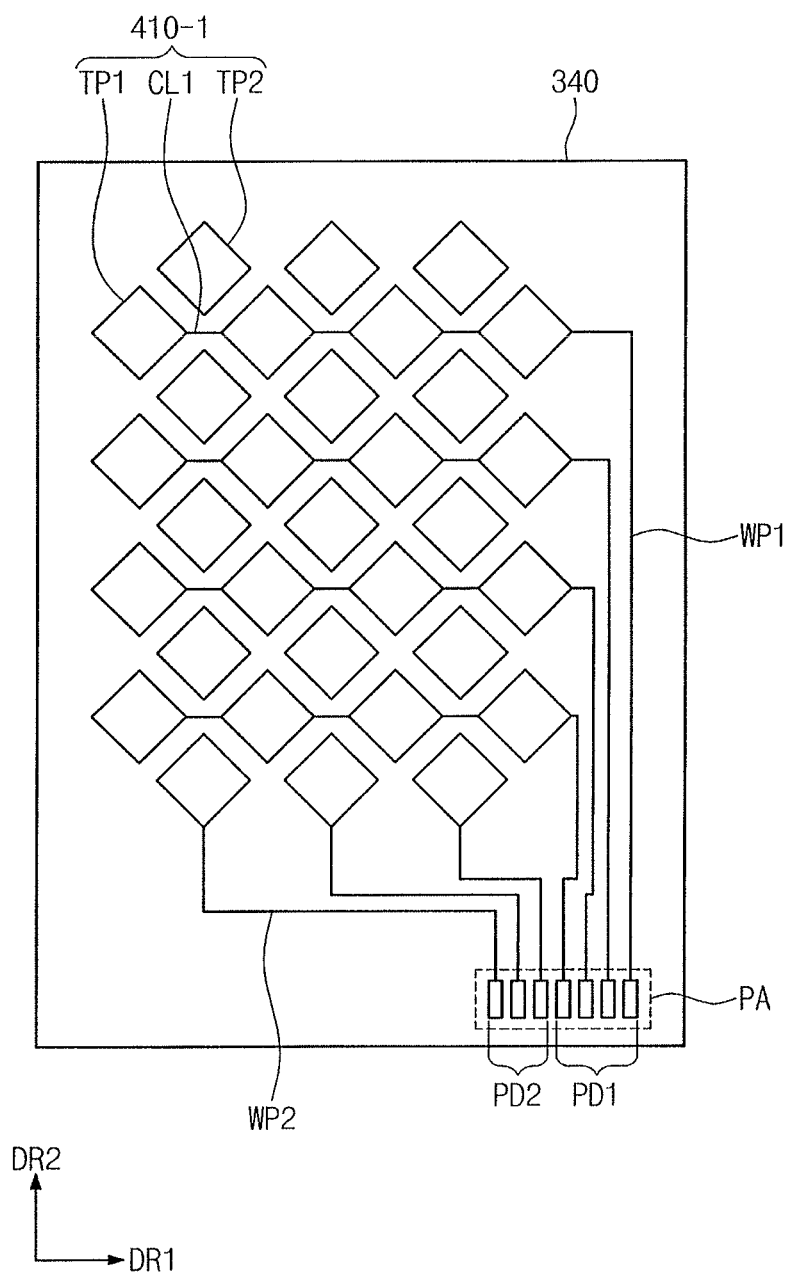
FIG. 5A illustrates a plan view showing a portion of a touch part according to another exemplary embodiment.
Figure 5B:
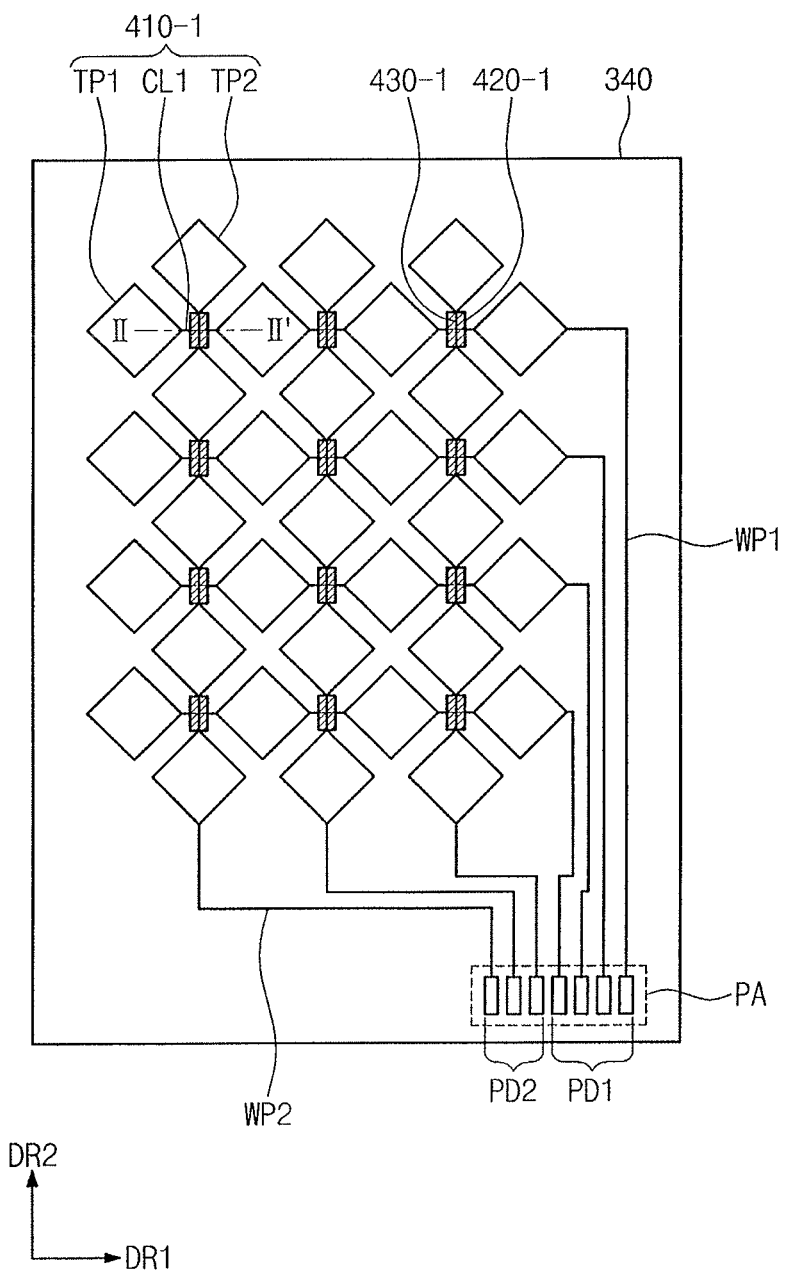
FIG. 5B illustrates a plan view showing a portion of a touch part according to an exemplary embodiment.
Figure 5C:
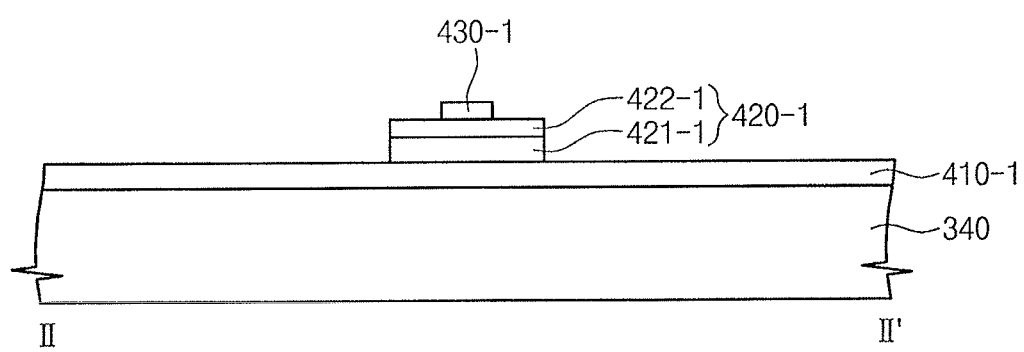
FIG. 5C illustrates a cross-sectional view taken along a line II-II' of FIG. 5B.

FIG. 5A illustrates a plan view showing a portion of a touch part according to another exemplary embodiment, FIG. 5B illustrates a plan view showing a portion of a touch part according to this exemplary embodiment, and FIG. 5C illustrates a cross-sectional view taken along a line II-II' of FIG. 5B. In FIGS. 5A to 5C, the same reference numerals denote the same elements in FIGS. 1 to 4C, and thus detailed descriptions of the same elements will not be repeated.

Referring to FIG. 5A, a first conductive layer 410-1 may be disposed on the thin film encapsulation layer 340. The first conductive layer 410-1 may include first sensing parts TP1, connection parts CP1, and second sensing parts TP2.

The first sensing parts TP1 may be arranged in the second direction DR2 and spaced apart from each other. The connection parts CP1 may be disposed between the first sensing parts TP1. Each of the connection parts CP1 may connect two first sensing parts adjacent to each other. The first sensing parts TP1 and the connection parts CP1 may correspond to the first touch electrodes 410a, 410b, 410c, and 410d shown in FIG. 4A.

The second sensing parts TP2 may be arranged in the first direction DR1 and may be spaced apart from each other. The second sensing parts TP2 may be electrically insulated from the first sensing parts TP1 and the connection parts CP1. The second sensing parts TP2 may have a shape corresponding to that of the second sensing parts TP2 shown in FIG. 4B.

The first conductive layer 410-1 may further include first outer wires WP1 and second outer wires WP2. The first outer wires WP1 may be connected to corresponding first sensing parts of the first sensing parts TP1 and the second outer wires WP2 may be connected to corresponding second sensing parts of the second sensing parts TP2.

The first and second outer wires WP1 and WP2 may extend in a pad area PA.

First pads PD1 may be disposed at one end of the first outer wires WP1 in the pad area PA, and second pads PD2 may be disposed at one end of the second outer wires WP2 in the pad area PA.

Referring to FIG. 5B, an insulating layer 420-1 and a second conductive layer 430-1 may be sequentially stacked on the first conductive layer 410-1. The insulating layer 420-1 includes a plurality of insulating patterns.

The insulating patterns may be respectively disposed between the second sensing parts TP2. The insulating patterns may be in an overlapping relationship with the connection parts CP1.

The second conductive layer 430-1 may include a plurality of conductive patterns, e.g., a plurality of bridge electrodes 430-1. The bridge electrodes 430-1 may be disposed on the insulating layer 420-1 and may be respectively insulated from the connection parts CP1 while respectively crossing the connection parts CP1. Each of the bridge electrodes 430-1 may connect two second sensing parts adjacent to each other among the second sensing parts TP2 through a thru-hole formed through the insulating layer 420-1 or may connect two second sensing parts among the second sensing parts TP2 along a side surface of the insulating layer 420-1.

Referring to FIG. 5C, the insulating layer 420-1 may overlap a portion of the first conductive layer 410-1. The insulating layer 420-1 may include a lower insulating layer 421-1 and an upper insulating layer 422-1, which are sequentially stacked on the first conductive layer 410-1. The lower and upper insulating layers 421-1 and 422-1 may include the same material as that of the lower and upper insulating layers 421 and 422 described with respect to in FIG. 4C.

In this case, the lower and upper insulating layers 421-1 and 422-1 may be substantially simultaneously patterned. Accordingly, the lower and upper insulating layers 421-1 and 422-1 have the same shape when viewed in a plan view. Side surfaces of the lower insulating layer 421-1 may be aligned with side surfaces of the upper insulating layer 422-1.

According to another embodiment, the insulating layer 420-1 may be integrally formed in a single unitary and individual unit to cover the first sensing parts TP1, the connection parts CP1, and the second sensing parts TP2.

According to another embodiment, the upper insulating layer 422-1 may have an area wider than that of the lower insulating layer 421-1 when viewed in a plan view. The upper insulating layer 422-1 may cover upper and side surfaces of the lower insulating layer 421-1, and thus the lower insulating layer 421-1 may be prevented from being damaged.

Figure 6:
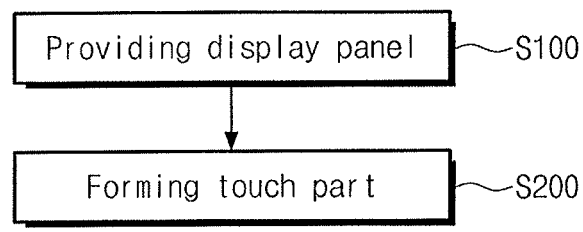
FIG. 6 illustrates a flowchart showing a method of manufacturing a display device according to an exemplary embodiment.
Figure 7:
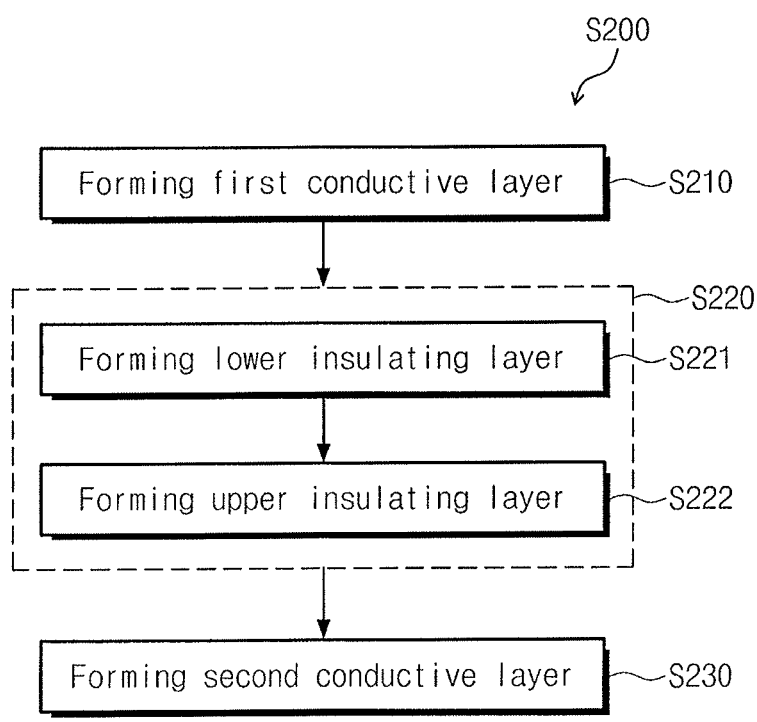
FIG. 7 illustrates a flowchart showing a portion of the manufacturing method shown in FIG. 6.

FIG. 6 illustrates a flowchart showing a method of manufacturing a display device according to an exemplary embodiment and FIG. 7 is a flowchart showing a portion of the manufacturing method shown in FIG. 6. Hereinafter, the manufacturing method of the display device will be described in detail with reference to FIGS. 6 and 7. In FIGS. 6 and 7, the same reference numerals denote the same elements in FIGS. 1 to 5C, and thus detailed descriptions of the same elements will not be repeated.

The manufacturing method of the display device may include providing the display panel (S100) and forming the touch part (S200). Forming the touch part (S200) may include forming the first conductive layer (S210), forming the insulating layer (S220), and forming the second conductive layer (S230).

Providing the display panel (S100) may be separately carried out from or successively carried out with the forming of the touch part (S200). For instance, providing the display panel may include loading a manufactured display panel into a vacuum chamber or may include forming the touch part (S200) successively in the vacuum chamber after the display panel is formed in the vacuum chamber.

Various display panels are used as the display panel. For example, providing the display panel (S100) may include providing an organic light emitting display panel. The organic light emitting display panel may include a base substrate, an organic light emitting diode disposed on the base substrate, and a thin film encapsulation layer disposed on the organic light emitting diode.

Forming the first conductive layer (S210) may include directly forming the first conductive layer on the thin film encapsulation layer. For example, forming of first conductive layer (S210) may include forming a base layer, which includes a conductive material, on the thin film encapsulation layer and patterning the base layer to form the conductive patterns. Forming the first conductive layer (S210) may be carried out through a wet etching process using the etching solution.

The conductive patterns may have various shapes. For instance, forming the first conductive layer (S210) may provide the first conductive layer 410 shown in FIG. 4A. The conductive patterns may include the first touch electrodes 410a, 410b, 410c, and 410d, the outer wires WP1, and the lower pads PDD.

According to another embodiment, forming the first conductive layer (S210) may provide the first conductive layer 410-1 shown in FIG. 5A. The conductive patterns may include the first sensing parts TP1, the second sensing parts TP2, the connection parts CP1, the outer wires WP, and the pads PD1 and PD2. The parts included in the conductive patterns may be substantially simultaneously formed or sequentially formed.

Forming the insulating layer (S220) may provide the insulating layer including silicon nitride on the first conductive layer. The insulating layer may have a shape appropriate to cover the entire surface of the first conductive layer as shown in FIG. 4B. In some implementations, the insulating layer may be patterned to form the insulating patterns that cover portions of the first conductive layer.

As described above, silicon nitride is the compound in which the silicon atoms are combined with the nitrogen atoms, and which further includes hydrogen atoms. The insulating layer may include silicon nitride molecules containing hydrogen atoms in various ratios.

Forming the insulating layer (S220) may be carried out by a low temperature deposition process performed at a temperature equal to or lower than about 85° C. For instance, the forming of the insulating layer (S220) may be performed through a plasma enhanced chemical vapor deposition (PECVD) at a temperature of about 70° C. When the forming of the insulating layer (S220) is performed at a low temperature, the organic light emitting diode included in the organic light emitting display panel may be prevented from being damaged.

Forming of insulating layer (S220) may include forming the lower insulating layer (S221) and forming the upper insulating layer (S222). Forming the lower insulating layer (S221) and forming the upper insulating layer (S222) may be carried out using different gases.

In forming the lower insulating layer (S221), a first gas may be supplied to form the lower insulating layer. The first gas may include nitrogen gas ($N_2$), ammonia gas ($NH_3$), silane gas ($SiH_4$), and hydrogen gas ($H_2$). The silane gas may react with the nitrogen gas in the vacuum chamber to form silicon nitride. The silicon nitride may be deposited on the first conductive layer to form the lower insulating layer.

The ratio of hydrogen gas in the first gas may be relatively high. In the present exemplary embodiment, the hydrogen gas may be provided in an amount about three times that of the silane gas in the first gas. The hydrogen gas may exert physical influence on the lower insulating layer when the lower insulating layer is deposited.

For instance, due to the hydrogen gas, a dangling bond becomes stable in the layer. In general, a dangling bond may be easily generated in an insulating layer that is formed by a low temperature deposition process. During the low temperature deposition process, energy of the deposition material may be lower than that of a deposition material formed by a high temperature deposition process.

Therefore, the deposition material may be deposited before a portion of outermost electrons of silicon atom of the silane gas have completely combined with a hole. As a result, the dangling bonds may exist in the layer. However, when the first gas includes hydrogen gas at a high rate, dangling bond passivation may be achieved.

In addition, the hydrogen atoms may physically collide with other atoms in the vacuum chamber. When the silicon nitride molecules are deposited, the hydrogen atoms may physically collide with the silicon nitride molecules. The mobility of the silicon nitride molecules may be improved due to the physical collision. The silicon nitride molecules may be physically scattered, and thus, the silicon nitride molecules may be uniformly deposited over a comparatively large area rather than over a specific area.

Thus, the silicon nitride molecules may be relatively densely deposited. When the lower insulating layer is formed by using the first gas, defects, e.g., voids, may be prevented from being formed in the lower insulating layer. Thus, the insulating layer having relatively high density may be formed.

As described above, the density of the layer may exert an influence on the breakdown voltage of the layer. When the lower insulating layer has a high density, the breakdown voltage of the lower insulating layer may be improved. Accordingly, the insulating layer formed using the first gas in forming the lower insulating layer (S221) may have improved electrical characteristics.

Forming the upper insulating layer (S222) may be carried out after forming the lower insulating layer (S221). Forming the upper insulating layer (S222) may be performed using a second gas different from the first gas. The second gas may include silane gas ($SiH_4$), nitrogen gas ($N_2$), and hydrogen gas ($H_2$).

The second gas may be substantially the same as the first gas except for not including ammonia gas. The second gas may provide a relatively smaller ratio of hydrogen atoms than that of the first gas.

When the ammonia gas is removed or absent, a probability of coupling between the silane atoms and the hydrogen atoms becomes lower compared to that in the forming of the lower insulating layer (S221). Accordingly, in forming the upper insulating layer (S222), the insulating layer having silicon nitride molecules, in which the amount of the hydrogen atoms is relatively low, is formed. In the present exemplary embodiment, the upper insulating layer may include about 20 at % or less of hydrogen atoms.

In addition, the second gas may include silane gas at a relatively lower ratio than that of the first gas. The amount of silane gas in the second gas may be smaller than the amount of silane gas in the first gas. Therefore, the upper insulating layer may have a smaller thickness than the lower insulating layer.

In the present exemplary embodiment, the breakdown voltage of the lower insulating layer may be higher than the breakdown voltage of the upper insulating layer. In forming the insulating layer (S220), the lower insulating layer may be formed to have a thickness greater than that of the upper insulating layer. Electrical durability of the insulating layer may be improved.

Forming of second conductive layer (S230) may be performed after forming the upper insulating layer (S222). For example, Forming the second conductive layer (S230) may include forming a base layer containing the conductive material on the upper insulating layer and patterning the base layer to form the conductive patterns.

The conductive patterns may be the conductive patterns 430 shown in FIG. 4B. In this case, forming the second conductive layer (S230) may include forming the second touch electrodes 430a, 430b, and 430c, the outer wires WP2, and the pads PD1 and PD2.

In other implementations, the conductive patterns may be the conductive patterns shown in FIG. 5B. In this case, the forming of the second conductive layer (S230) may include forming the bridge electrodes CP2. The parts included in the conductive patterns may be substantially simultaneously formed by patterning the base layer or sequentially patterned.

Forming the second conductive layer (S230) may be carried out by a wet etching process using an etching solution. In the present exemplary embodiment, the second conductive layer may include copper. Accordingly, the etching solution may include a material having a high reactivity to copper.

The etching solution used in the forming of the second conductive layer (S230) may contact the insulating layer exposed when the base layer is patterned. In general, the etching solution may have a high reactivity to the silicon nitride layer formed by the low temperature deposition process. The silicon nitride layer formed by the low temperature deposition process may be at risk for being easily damaged in the forming of the second conductive layer (S230).

The insulating layer according to the present exemplary embodiment has the double-layer structure in which the upper insulating layer covers the lower insulating layer. As described above, the upper insulating layer may include about 20 at % or less of the hydrogen atoms. Thus, the etching rate of the upper insulating layer may be only about 3 Å/s with respect to the etching solution.

The display device according to the present exemplary embodiment may include the upper insulating layer. The insulating layer may be prevented from being damaged from the etching solution used in the forming of the second conductive layer (S230). According to the manufacturing method of the display device, the insulating layer may be formed by the low temperature deposition process. The display device may have improved reliability.

The lower insulating layer may have a high breakdown voltage and may be covered by the upper insulating layer having a low etching rate. Accordingly, the electrical and physical durability of the display device may be improved. The reliability of the display device may be improved, a yield of the display device may be increased, and the reliability in use of the display device may be improved.

By way of summation and review, a touch part of a display device may be directly disposed on the display part. In this case, it is desirable that processes of forming the touch part be performed under an environment such as to prevent the display part from being damaged.

Embodiments provide a display device including a touch part directly disposed on a display part and having improved durability and electrical property.

Embodiments provide a method of manufacturing the display device that is capable of preventing an insulating layer from being damaged under a low temperature environment.

According to embodiments, the display device manufactured by the manufacturing method includes the display part and the touch part. The touch part includes the first and second conductive layers sequentially stacked and the insulating layer disposed between the first and second conductive layers and configured to include two layers. The insulating layer includes the lower layer and the upper layer having the hydrogen atomic percent lower than that of the lower layer.

Since the upper layer has the low hydrogen atomic percent, the reactivity of the upper layer becomes lower with respect to the etching solution, and thus the etching rate of the upper layer is decreased. Therefore, the stability of the insulating layer against the etching solution used in the forming of the second conductive layer is improved, so that physical durability and yield of the display device are improved.

In addition, since the lower layer has a density higher than that of the upper layer, the lower layer has the high breakdown voltage. Thus, although the manufacturing method of the display device is performed at the low temperature, electrical durability of the display device is increased, and thus reliability in use of the display device is improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. A display device, comprising:
a display part configured to display an image; and
a touch part on the display part, the touch part comprising:
    a first conductive layer on the display part;
    a second conductive layer on the first conductive layer; and
    an inorganic layer between the first conductive layer and the second conductive layer,
wherein the inorganic layer comprises:
    a first part adjacent to the first conductive layer; and a second part closer to the second conductive layer than the first part, and wherein the second part comprises a same material as the first part, a density of the same material being relatively higher in the first part than the second part.

2. The display device of claim 1, wherein a hydrogen atomic percent of the second part is less than a hydrogen atomic percent of the first part.

3. The display device of claim 2, wherein the hydrogen atomic percent of the second part is greater than 0 and less than or equal to about 20.

4. The display device of claim 3, wherein:
the inorganic layer comprises silicon nitride; and
the second conductive layer comprises copper.

5. The display device of claim 2, wherein a breakdown voltage of the first part is greater than or equal to about 5 MV/cm.

6. The display device of claim 5, wherein a thickness of the first part is greater than a thickness of the second part.

7. The display device of claim 1, wherein:
the display part comprises:
 a base substrate;
 an organic light emitting diode on the base substrate; and
 a thin film encapsulation layer on the base substrate, the thin film encapsulation layer covering the organic light emitting diode and comprising an inorganic material; and
the first conductive layer is directly on the thin film encapsulation layer.

8. The display device of claim 7, wherein:
the first conductive layer comprises first touch electrodes on the thin film encapsulation layer, the first touch electrodes extending in a first direction and being arranged in a second direction crossing the first direction; and
the second conductive layer comprises second touch electrodes respectively crossing the first touch electrodes and being insulated from the first touch electrodes by the second part and the first part.

9. The display device of claim 8, wherein:
each of the first touch electrodes comprises:
 first sensing parts arranged in the first direction and spaced apart from each other; and
 first connection parts, each of the first connection parts being between adjacent first sensing parts among the first sensing parts to connect the adjacent first sensing parts to each other; and
each of the second touch electrodes comprises:
 second sensing parts arranged in the second direction and spaced apart from each other; and
 second connection parts, each of the second connection parts being between adjacent second sensing parts among the second sensing parts to connect the adjacent second sensing parts to each other.

10. The display device of claim 7, wherein:
the first conductive layer comprises:
 first sensing parts on the thin film encapsulation layer, the first sensing parts being arranged in a first direction and spaced apart from each other;
 connection parts on the thin film encapsulation layer and extending in the first direction, each connection part connecting adjacent first sensing parts to each other among the first sensing parts; and
 second sensing parts on the thin film encapsulation layer, the second sensing parts being arranged in a second direction crossing the first direction, spaced apart from each other, and insulated from the first sensing parts and the connection parts;
the second conductive layer comprises bridge electrodes on the second part and the first part; and
each of the bridge electrodes connects adjacent second sensing parts to each other among the second sensing parts through a thru-hole in the second part and the first part.

11. The display device of claim 1, wherein:
the first part contacts the first conductive layer; and
the second part contacts the second conductive layer.

12. A display device, comprising:
a display part configured to display an image;
a touch part on the display part, the touch part comprising:
 a first conductive layer on the display part;
 a second conductive layer on the first conductive layer; and
 an inorganic layer between the first conductive layer and the second conductive layer, the inorganic layer comprising a first part and a second part that comprise a same material as each other,
wherein the first conductive layer comprises:
 first sensing parts arranged in a first direction and spaced apart from each other;
 first connection parts, each of the first connection parts being between adjacent first sensing parts among the first sensing parts to connect the adjacent first sensing parts to each other; and
 second sensing parts arranged in a second direction crossing the first direction, the second sensing parts being spaced apart from each other and insulated from the first sensing parts,
wherein the second conductive layer comprises second connection parts on the second part, each of the second connection parts being between adjacent second sensing parts among the second sensing parts to connect the adjacent second sensing parts to each other, and
wherein sides of each of the first part and the second part are aligned with each other and expose a portion of the first conductive layer.

13. The display device of claim 12, wherein a density of the same material is relatively higher in the first part than the second part.

14. The display device of claim 12, wherein a hydrogen atomic percent of the second part is less than a hydrogen atomic percent of the first part.

15. The display device of claim 14, wherein the hydrogen atomic percent of the second part is greater than 0 and less than or equal to about 20.

16. The display device of claim 15, wherein:
the inorganic layer comprises silicon nitride; and
the second conductive layer comprises copper.

17. The display device of claim 12, wherein a breakdown voltage of the first part is greater than or equal to about 5 MV/cm.

18. The display device of claim 17, wherein a thickness of the first part is greater than a thickness of the second part.

* * * * *